(12) United States Patent
Birkmeyer et al.

(10) Patent No.: US 7,681,307 B2
(45) Date of Patent: Mar. 23, 2010

(54) SOLDERING A FLEXIBLE CIRCUIT

(75) Inventors: Jeffrey Birkmeyer, San Jose, CA (US); Andreas Bibl, Los Altos, CA (US)

(73) Assignee: FUJIFILM Dimatix, Inc., Lebanon, NH (US)

( * ) Notice: Subject to any disclaimer, the term of this patent is extended or adjusted under 35 U.S.C. 154(b) by 264 days.

(21) Appl. No.: 11/775,817

(22) Filed: Jul. 10, 2007

(65) Prior Publication Data
US 2008/0010820 A1 Jan. 17, 2008

Related U.S. Application Data

(62) Division of application No. 10/950,284, filed on Sep. 23, 2004, now Pat. No. 7,249,826.

(51) Int. Cl.
*H05K 3/34* (2006.01)
*H01L 21/44* (2006.01)

(52) U.S. Cl. ............................. 29/840; 29/846; 29/852; 438/612; 438/613

(58) Field of Classification Search ................. 29/825, 29/840, 846, 852; 438/612, 613
See application file for complete search history.

(56) References Cited

U.S. PATENT DOCUMENTS

| | | | |
|---|---|---|---|
| 4,530,464 A | 7/1985 | Yamamoto et al. | |
| 5,779,971 A | 7/1998 | Tsung Pan et al. | |
| 5,798,285 A * | 8/1998 | Bentlage et al. ............. | 438/108 |
| 6,012,224 A * | 1/2000 | DiStefano et al. ............. | 29/840 |
| 6,350,633 B1 * | 2/2002 | Lin ............................. | 438/113 |
| 6,562,657 B1 * | 5/2003 | Lin ............................. | 438/113 |
| 6,562,709 B1 * | 5/2003 | Lin ............................. | 438/618 |
| 6,593,220 B1 | 7/2003 | Yu et al. | |
| 6,840,601 B2 | 1/2005 | Miyata | |
| 6,979,074 B2 | 12/2005 | Watanabe et al. | |
| 7,040,002 B2 | 5/2006 | Castiglioni et al. | |
| 2002/0130928 A1 | 9/2002 | Kondo et al. | |
| 2003/0214564 A1 | 11/2003 | Miyata | |
| 2004/0040742 A1 | 3/2004 | Ishizaki | |
| 2004/0113994 A1 | 6/2004 | Shinkai | |

FOREIGN PATENT DOCUMENTS

| | | |
|---|---|---|
| EP | 0 974 465 A1 | 1/2000 |
| EP | 1 245 390 A1 | 10/2002 |

OTHER PUBLICATIONS

Xiao et al., "A pressure sensor using flip-chip on low-cost flexible substrate", May 29, 2001, 2001 Proceeding 51*st* Electronic Components and Technology Conference, New York, NY, pp. 750-754.
International Search Report and Written Opinion of the International Searching Authority, International Application Serial No. PCT/US2005/034181, Jan. 20, 2006, 9 pp.

* cited by examiner

*Primary Examiner*—C. J Arbes
(74) *Attorney, Agent, or Firm*—Fish & Richardson P.C.

(57) ABSTRACT

Techniques are provided for controlling solder flow in applications where a flexible circuit is soldered to a microelectromechanical structure. A metal layer is formed on a substrate. A solder mask is formed on the metal layer such that portions of the metal layer are covered by the mask and portions are left exposed. A flexible circuit is soldered to the metal layer in at least some of the areas where the metal layer is exposed.

20 Claims, 5 Drawing Sheets

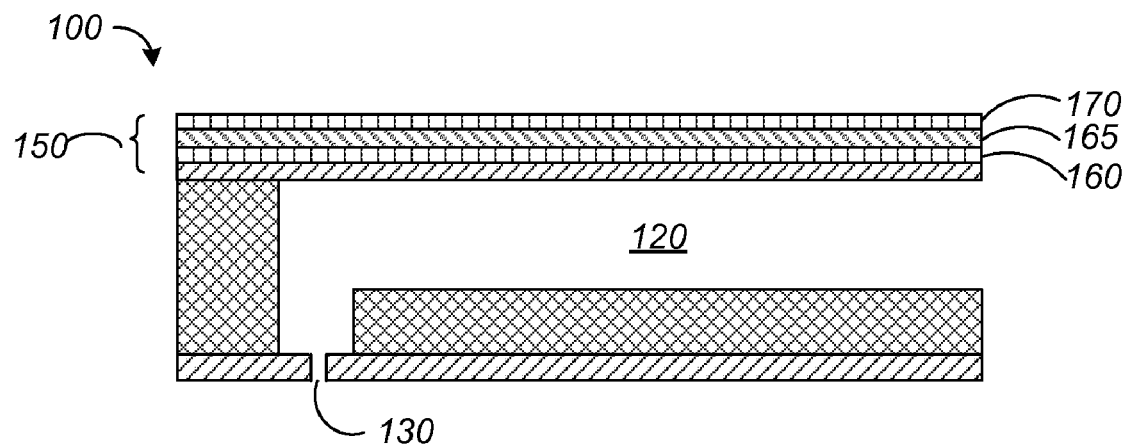
FIG._1
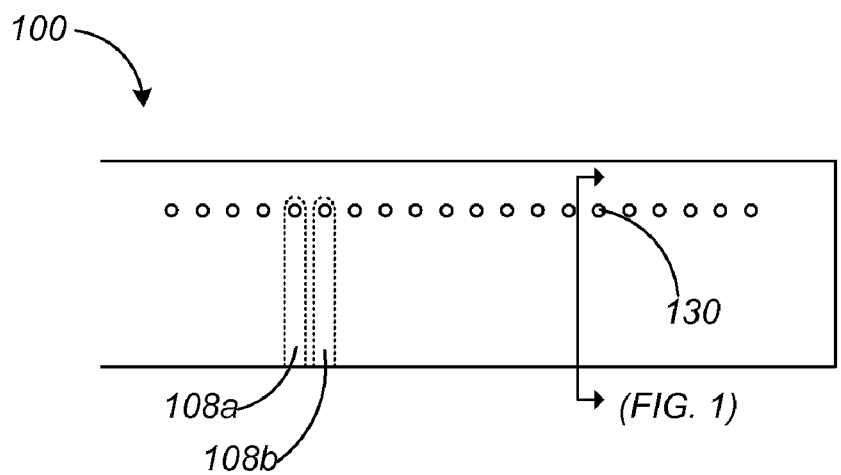
FIG._2

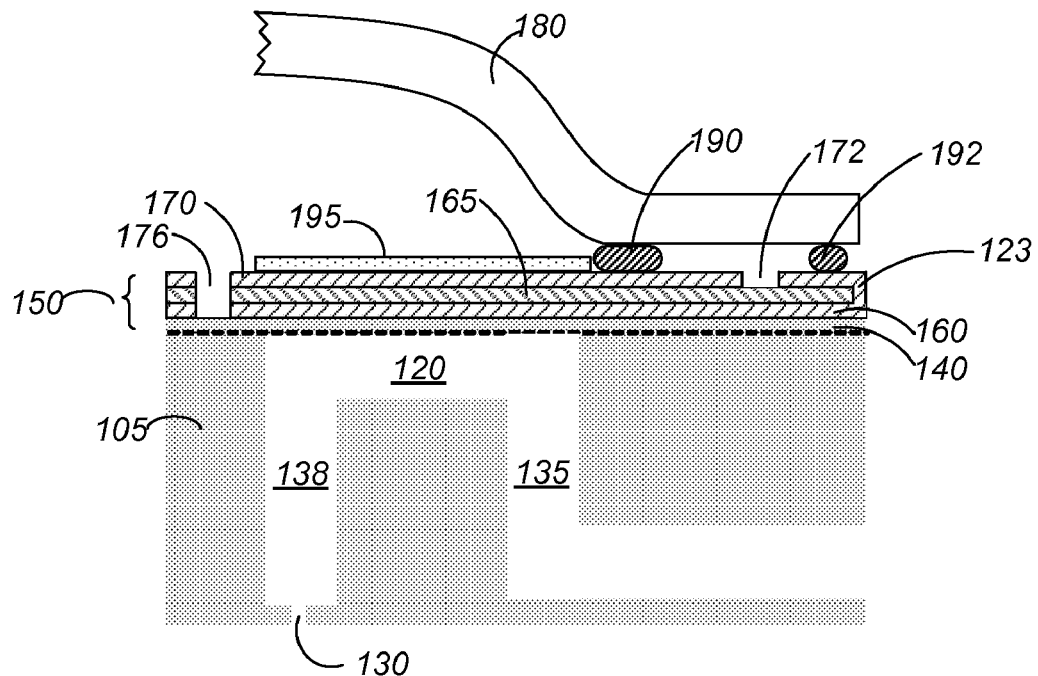
FIG._3
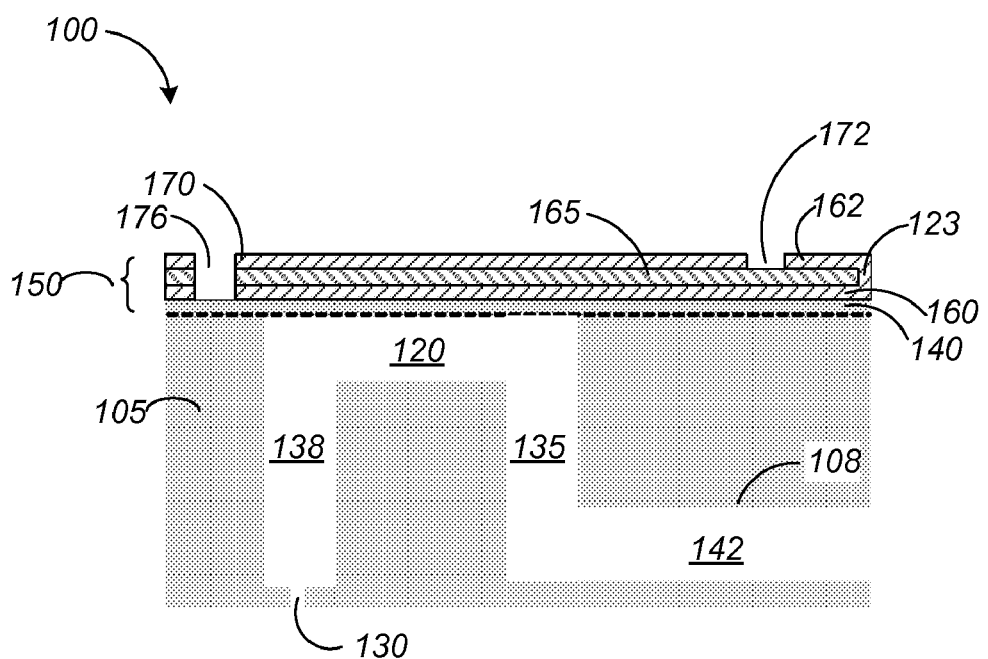
FIG._4

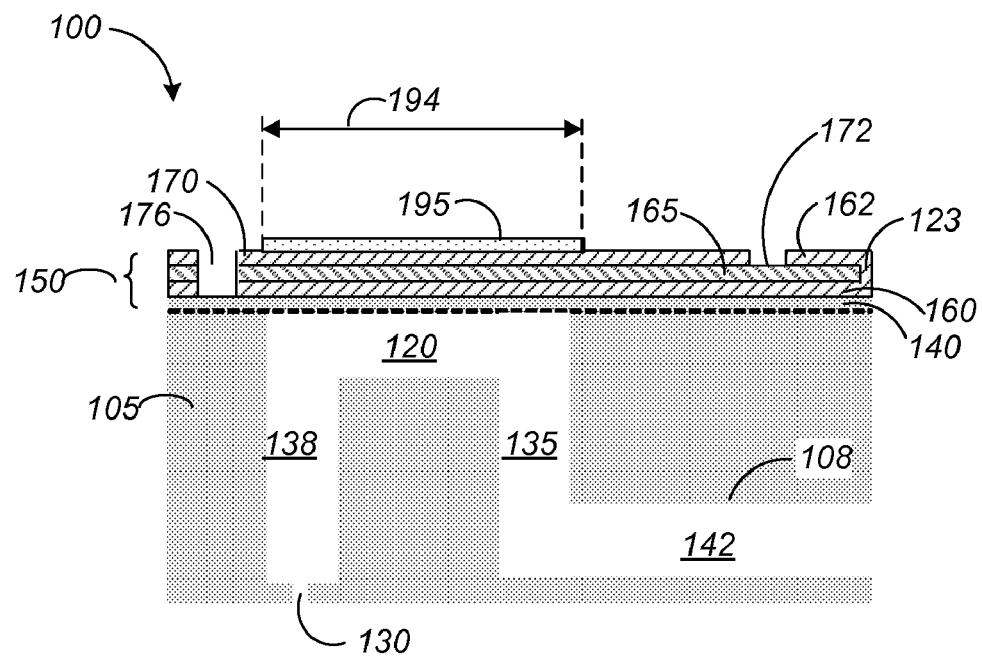
FIG._5A
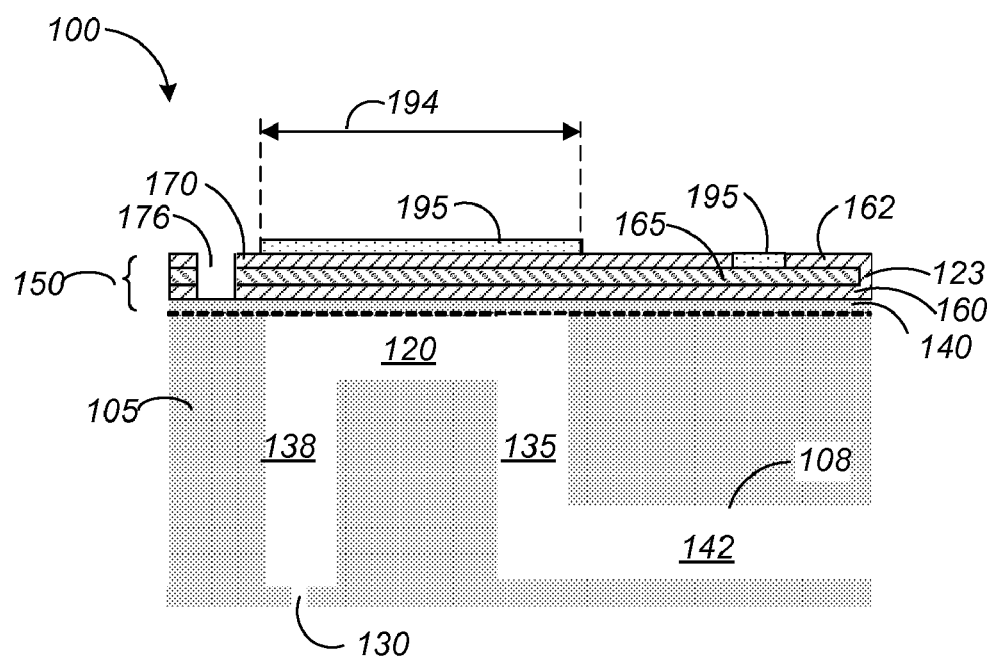
FIG._5B

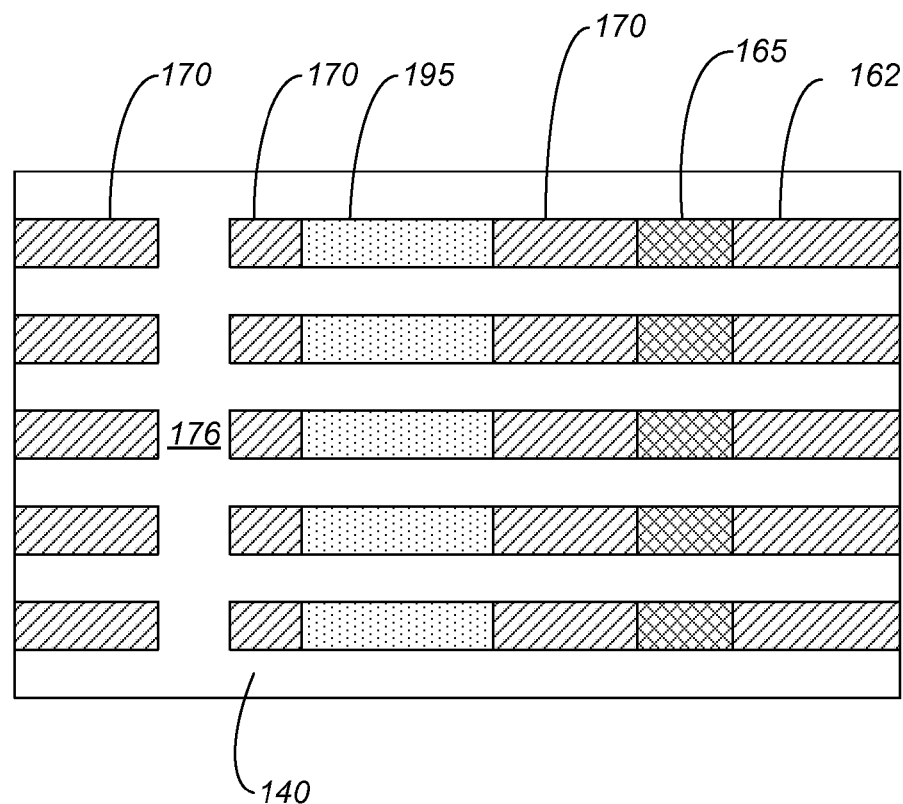
*FIG._6*
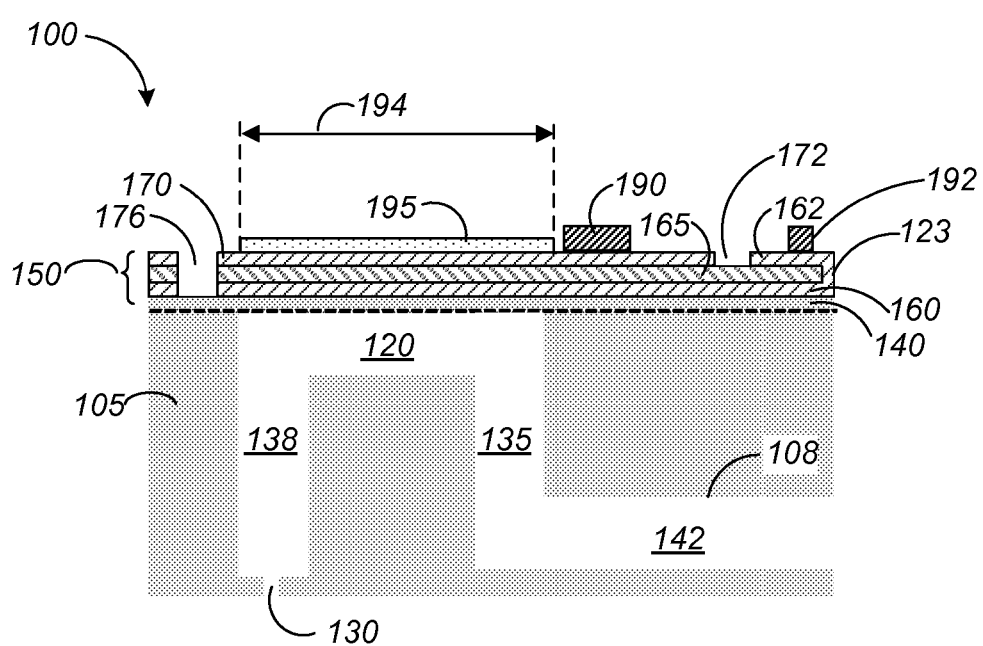
*FIG._7*

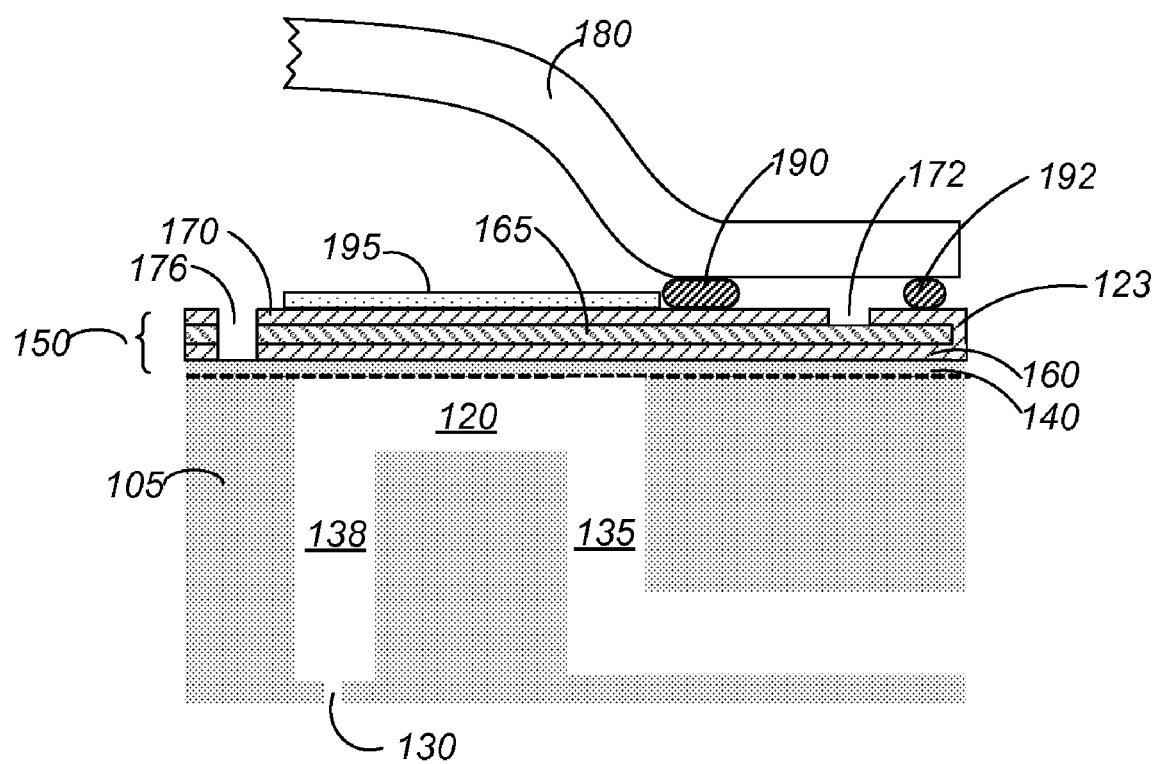
FIG._8

SOLDERING A FLEXIBLE CIRCUIT

CROSS-REFERENCE TO RELATED APPLICATIONS

This application is a divisional application of and claims the benefit of priority under 35 U.S.C. Section 120 of U.S. application Ser. No. 10/950,284, filed on Sep. 23, 2004. The disclosure of the prior application is considered part of and is incorporated by reference in the disclosure of this application.

BACKGROUND

This invention relates to soldering flexible circuits to electrical contacts on devices, such as printhead actuators.

Ink jet printers form an image by selectively depositing ink onto a receiving media. In a conventional ink jet printer system, the ink is stored in an ink storage unit, such as an ink reservoir or cartridge, and directed from the storage unit into a printhead 100, as shown in FIG. 1. In the printhead 100, ink flows into an ink pumping chamber 120 to a nozzle 130, where the ink is ejected. Typically, the printhead includes an actuator that forces ink out of the printhead 100 through the nozzle 130. Two common types of actuators include resistive heating actuators and piezoelectric actuators. In a piezoelectric actuator 150, a layer of piezoelectric material 165 can be formed adjacent to the ink pumping chamber 120. Applying a voltage across the piezoelectric material 165 causes the piezoelectric material to bend or deform, and the deformation of the piezoelectric material 165 causes a pressure wave to propagate through the ink pumping chamber 120, pushing ink out of the nozzle 130 and onto the receiving media. Typically, electrodes 160, 170 are formed on either side of the piezoelectric layer 165 to enable voltage to be applied across the layer 165.

In so-called "drop on demand" printers, multiple flow paths 108a and 108b (shown in phantom in FIG. 2) and associated nozzles 130 can be formed in a single printhead 100 and each nozzle 130 can be individually activated. Thus, a particular nozzle fires only when a droplet of ink from that nozzle is desired. To activate a particular actuator on the printhead, an electrical signal typically is individually communicated to that actuator. The electrical signal can be communicated to the actuator by a flexible circuit connected to the printhead.

SUMMARY

In general, in one aspect, the invention features an actuator with first and second electrodes and a piezoelectric layer disposed between the electrodes. A mask is formed on the first electrode, wherein the mask is adjacent to a first portion of the first electrode. A solder material is supported by the first electrode and is adjacent to a second portion of the first electrode. The first portion of the first electrode does not overlap the second portion of the first electrode and the mask includes a material that is substantially non-wettable by the solder material when the solder material is melted.

The mask can include an oxide material. The mask can be between about 0.1 and 2 microns thick, such as around 0.5 microns. The solder material can electrically connect the electrodes to an integrated circuit. The actuator can be attached to a flexible circuit. The first portion can correspond to a location in a device when the second electrode is bonded to the device.

In another aspect, the invention features a method of forming a microelectromechanical device. The method includes forming an actuator on a top surface of a substrate, the actuator including a piezoelectric layer, a first electrode and a second electrode. A solder mask is formed on the first electrode so that a first portion of the first electrode is exposed to the environment and a second portion of the first electrode is covered by the solder mask. A solder is applied to the first electrode at the first portion of the first electrode. A flexible circuit is contacted to the solder. The solder is heated to cause the solder to electrically connect the flexible circuit to the first electrode wherein the solder mask prevents the solder from flowing over the first portion when the solder is heated.

Particular implementations can include one or more (or none) of the following advantages. By forming the solder mask over the pumping chamber of a printhead, the amount of solder that flows over the pumping chambers can be reduced. A layer of solder on the actuator can cause the actuator to become very stiff and difficult to actuate. In addition, a layer of solder on the actuator can increase the mass of the actuator. Therefore, reducing the amount of solder over each pumping chamber can improve the uniformity of the mass and flexural modulus of the actuator from flow path to flow path and from printhead to printhead. This can directly improve the uniformity of the actuator characteristics, such as the drive characteristics. Thus, keeping solder from the active regions can contribute to maintenance of uniform drive characteristics both between flow paths and between printheads. A very thin layer of a solder mask, such as an oxide, can change the actuator characteristics very little. The mask material may tend to cause at least some types of melted solder to flow away from the oxide and toward a wettable material, such as a metal. Controlling the size and position of the solder mask can be easier than controlling the melted solder without a solder mask. Any change in the actuators' performance caused by the addition of the solder mask can be uniformly controlled. Controlling the solder flow can also prevent electrical shorting of the printhead. The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 is a side view of a single flow path in a printhead with a piezoelectric actuator.

FIG. 2 is a bottom view of a printhead with multiple nozzles.

FIG. 3 is a cross-sectional view of a printhead flow path with an actuator and circuit.

FIG. 4 is a cross-sectional view of a printhead flow path with a partially formed actuator.

FIGS. 5A and 5B are a cross-sectional views of a printhead with a solder mask.

FIG. 6 is a plan view of the membrane and actuator structures.

FIG. 7 is a cross-sectional view of a printhead with a solder mask and solder.

FIG. 8 shows a printhead with a flexible circuit bonded to the actuator.

Like reference symbols in the various drawings indicate like elements.

DETAILED DESCRIPTION

Techniques are provided for controlling the location of solder when the solder is melted on an actuator. The techniques can be implemented to control the flow of solder used to connect an integrated circuit to the actuator of a microelectromechanical device, such as an ink jet printhead.

Referring to FIG. 3, a printhead 100 includes a substrate 105 in which multiple flow paths 108 are formed. A single flow path 108 can include an ink inlet 142, an ascender 135, a pumping chamber 120, a descender 138 and a nozzle 130. A piezoelectric actuator 150 is supported by the substrate 105. The actuator 150 can include a membrane 140 that seals the pumping chamber 120. The actuator 150 can include a lower electrode 160, a piezoelectric layer 165 and an upper electrode 170. The electrodes 160, 170 can be about two microns in thickness or less, such as about 0.5 microns. The piezoelectric layer 165 can be between about 1 and 25 microns thick, e.g., about 8 to about 18 microns thick. The electrodes 160, 170 are formed of a conductive material, such as a metal, e.g., copper, gold, tungsten, tin, indium-tin-oxide (ITO), titanium, platinum, nickel, nickel chromium alloy or a combination of metals. A signal can be provided to the electrodes 160, 170 to electrically activate the actuator 150. An electrode separation gap 172 can separate the upper electrode 170 from a lower electrode 160.

Kerfs 176 separate individual actuators and allow for connecting the electrodes. A first kerf (not shown) can separate the actuator over one flow path from the actuator over a neighboring flow path. A second kerf 176 in the actuator 150 can separate neighboring actuators. In addition, the second kerf 176 can reduce the actuator size such that the actuator is only over a portion of each corresponding flow path. The kerfs can reduce crosstalk between the actuators.

Referring to FIG. 4, an actuator is formed on a substrate 105 with the flow path features formed therein. The actuator can be formed by any suitable method. One particular method is described below. Initially, the piezoelectric layer 165 and the lower electrode 160 can be applied to the back side of the substrate 105. In one implementation, the piezoelectric layer 165 is metalized with a metal that will subsequently form the lower electrode 160. The piezoelectric layer 165 can be formed of a ceramic green sheet or a prefired piezoelectric material. The metal can be deposited by sputtering. The metals for deposit can include copper, gold, tungsten, tin, indium-tin-oxide (ITO), titanium, platinum, nickel, nickel chromium alloy or a combination of two or more of these metals. The piezoelectric layer 165 is then bonded onto the substrate, such as with an adhesive or with a eutectic bond between two metals. In another implementation, the substrate 105 is metallized and the piezoelectric layer 165 is formed on the metal layer, such as by physical vapor deposition (PVD), sol gel application, bonding ceramic green sheets or another suitable deposition process.

Kerfs 176 are then formed in the piezoelectric layer 165. The kerfs 176 can be cut, diced, sawed or etched into the piezoelectric layer 165. The kerfs 176 can extend into the lower electrode 160 as well as the piezoelectric layer 165. The piezoelectric layer 165 can be metalized, such as by vacuum depositing, e.g., sputtering, to form the upper electrode 170, the lower electrode contact area 162 and a via 123 on the piezoelectric layer 165. The top metallization can be patterned to remove metal in the kerf 176 and in an electrode separation gap 172.

Referring to FIG. 5A, the printhead 100 is shown with a solder mask 195. The solder mask 195 is formed on the upper electrode 170 over a first region 194 of the upper electrode 170 that overlies the pumping chamber 120. The edge of the solder mask 195 can extend to the edge of the first region 194 or extend beyond the first region 194. From one flow path to the next flow path, the extent of the solder mask 195 is kept uniform to improve uniformity between the flow paths. The solder mask 195 can have a thickness between about 0.1 and 5 microns, such as about 0.5 microns. The solder mask can be configured to cover more or less of the upper electrode 170. In one implementation, the solder mask 195 is configured to control the location of the solder on the lower electrode contact area 162, as shown in FIG. 5B.

To form the solder mask 195, a layer of the material used to make the mask is deposited on the upper electrode 170, such as by a plasma enhanced chemical vapor deposition technique. The solder mask 195 can be formed of an oxide, such as a silicon oxide. A photopatternable material or photoresist is applied on the surface of the solder mask material. A mask is provided over the photoresist that corresponds to the regions 194 over the pumping chamber 120. The photoresist is exposed and developed. The solder mask material is etched, such as by a dry etch process, in the areas no longer covered by the photoresist. Inductively coupled plasma reactive ion etching is one example of an etch process that can be used to etch the exposed portions of the solder mask material. After the solder mask material is etched, the remaining material is substantially confined to the region 194 overlying the pumping chamber 120. The remaining photoresist is then removed from the upper electrode 170.

Referring to FIG. 6, a plan view of a portion of the membrane 140, with the upper electrode 170, exposed piezoelectric layer 165, lower electrode contact area 162, solder mask 195 and kerf 176.

Referring to FIG. 7, a solder 190 is applied to the upper electrode 170. The solder 190 can be forced through a mask onto the substrate. Solder 190 is applied to the upper electrode 170 to form an electrical contact for the upper electrode 170. Solder 192 is applied in the lower electrode contact 162 area to form an electrical contact to the lower electrode 160. The solder includes a conductive material, such as a metal, including tin and lead, that can be heated to a temperature that causes the metal to flow and form a electrical bond to another conductive material, such as the upper and lower electrodes 170, 160.

Referring to FIG. 8, an integrated circuit, such as an integrated circuit that is attached to a flexible circuit 180, is electrically connected to the upper and lower electrodes 170, 160. The flexible circuit can include contact pads that are electrically connected to the integrated circuit. The contact pads allow the flexible circuit to be electrically connected to the upper and lower electrodes 170, 160. In one implementation, the upper electrode contact pads provide the drive voltage while the lower electrode pads are electrically connected to ground.

The flexible circuit 180 and substrate 105 are run through a thermal cycle, such as around 183° C., causing the solder to flow. The melted solder forms a bond to both the electrodes and the contact pads. The electrodes are therefore conductively connected to the integrated circuits through the contact pads. The solder mask 195 prevents the melted solder from flowing over the mask 195 because the solder mask 195 is not wetted by the solder 190. When the solder returns to a temperature below that at which the solder flows, the solder returns to a solid form.

Forming a solder mask onto the actuator prior to bonding the flexible circuit can be advantageous in that the mask can control the location of the solder when the solder is melted. Without the oxide layer, the solder can spread in an uncontrolled manner over the actuator. In some portions of the actuator, kerfs are cut to electrically isolate layers, such as the upper electrode and the lower electrode. In one implementation, the solder mask can be applied in the kerfs 176. If the solder flows to areas where the solder connects layers that should be electrically isolated, electrical shorting can occur. A solder mask in these areas can prevent shorting between the electrodes, such as in the electrode separation gap 172.

The solder mask can be formed over the region of the actuator over the pumping chamber and any other region where solder is not desired. An oxide, such as a silicon oxide, can be selected for the solder mask because oxides are not wettable by a melted solder. Oxides tend to be stable and can be formed in a very thin layer while still retaining non-wettable characteristics. However, other materials, such as nitride, polyimide or other patternable materials, can alternatively be used to form the solder mask.

As mentioned above, applying a solder mask prevents the solder from covering the area of the actuator that overlies the pumping chamber. This maintains uniform solder application from one actuator to the next actuator. Uniform solder application can help maintain uniform actuator characteristics. The mass of the portions of the actuator that overlie the pumping chamber can be kept down to little more than the mass of the actuator components, i.e., the electrodes, the piezoelectric layer and the membrane. Any additional mass from the oxide layer can be controlled. Conversely, additional mass from solder is more difficult to control. Adding mass to the active region is undesirable because it changes the drive characteristics of the associated actuator. In addition, adding the solder layer to the actuator increases the stiffness of the actuator, making the actuator more difficult to bend. The combination of forming substantially consistently sized solder masks to each actuator and preventing solder from flowing over the active regions contributes to uniformity between actuators of a printhead or between printheads.

A number of embodiments of the invention have been described. Nevertheless, it will be understood that various modifications may be made without departing from the spirit and scope of the invention. For example, the piezoelectric actuator can form a side wall of the pumping chamber. The solder mask can be applied to an actuator that has an electrode only on one side of the piezoelectric layer, rather than on both sides. The invention can also be applied to ejecting fluids other than ink from microelectromechanical structures. Alternatively, the invention can be applied to any sensor microelectromechanical structure that requires bonding a connection to an integrated circuit. The techniques disclosed above can be used to control the placement of solder when soldering any components on a microelectromechanical device. Accordingly, other embodiments are within the scope of the following claims.

What is claimed is:

1. A method of forming a microelectromechanical device, comprising:
    forming an actuator over a chamber in a substrate, the actuator including a piezoelectric layer and a first electrode;
    forming a solder mask on the first electrode so that a first portion of the first electrode is exposed to the environment and a second portion of the first electrode is covered by the solder mask, wherein the second portion overlies the length of the chamber;
    applying solder to the first electrode at the first portion of the first electrode;
    contacting a flexible circuit to the solder; and
    heating the solder to cause the solder to electrically connect the flexible circuit to the first electrode wherein the solder mask prevents the solder from flowing over the second portion when the solder is heated.

2. The method of claim 1, wherein forming a solder mask includes applying a material that is substantially not wettable by the solder when melted.

3. The method of claim 1, wherein forming a solder mask includes depositing an oxide.

4. The method of claim 1, wherein forming a solder mask includes forming a solder mask that does not melt at or below a melting temperature of the solder.

5. The method of claim 1, wherein forming the solder mask includes forming the solder mask to be between about 0.1 and about 2 microns thick.

6. The method of claim 5, wherein forming the solder mask includes forming the solder mask to be about 0.5 microns thick.

7. The method of claim 1, further comprising forming a second electrode adjacent to the first electrode, wherein there is an electrode separation gap defined by a space that separates the first electrode and second electrode, and forming the solder mask forms the mask in the electrode separation gap.

8. The method of claim 7, wherein the actuator is a first actuator and the method further comprises:
    forming a second actuator on the substrate and adjacent to the first actuator, wherein a kerf is defined by a space that separates the first actuator and second actuator, and forming the solder mask includes forming the mask in the kerf.

9. The method of claim 1, wherein forming a solder mask includes depositing silicon oxide.

10. The method of claim 1, wherein forming a solder mask includes forming the solder mask with its edges aligned with ends of the chamber.

11. A method of forming a microelectromechanical device, comprising:
    forming an actuator over a chamber in a substrate, the actuator including a piezoelectric layer and a first electrode;
    forming a solder mask on the first electrode so that a first portion of the first electrode is exposed to the environment and a second portion of the first electrode is covered by the solder mask, wherein the second portion overlies the length of the chamber;
    after forming the solder mask, applying solder to the first electrode at the first portion of the first electrode;
    contacting a flexible circuit to the solder; and
    heating the solder to cause the solder to flow and electrically connect the flexible circuit to the first electrode wherein when the solder flows toward the solder mask and is directly adjacent to the solder mask while the solder mask prevents the solder from flowing over the second portion.

12. The method of claim 11, wherein forming a solder mask includes applying a material that is substantially not wettable by the solder when melted.

13. The method of claim 11, wherein forming a solder mask includes depositing an oxide.

14. The method of claim 11, wherein forming a solder mask includes depositing silicon oxide.

15. The method of claim 11, wherein forming a solder mask includes forming a solder mask that does not melt at or below a melting temperature of the solder.

16. The method of claim 11, wherein forming the solder mask includes forming the solder mask to be between about 0.1 and about 2 microns thick.

17. The method of claim 16, wherein forming the solder mask includes forming the solder mask to be about 0.5 microns thick.

18. The method of claim 11, further comprising forming a second electrode adjacent to the first electrode, wherein there is an electrode separation gap defined by a space that separates the first electrode and second electrode, and forming the solder mask forms the mask in the electrode separation gap.

19. The method of claim 18, wherein the actuator is a first actuator and the method further comprises:

forming a second actuator on the substrate and adjacent to the first actuator, wherein a kerf is defined by a space that separates the first actuator and second actuator, and forming the solder mask includes forming the mask in the kerf.

20. The method of claim 11, wherein forming a solder mask includes forming the solder mask with its edges aligned with ends of the chamber.

* * * * *